(12) United States Patent
Breil et al.

(10) Patent No.: US 9,093,424 B2
(45) Date of Patent: Jul. 28, 2015

(54) DUAL SILICIDE INTEGRATION WITH LASER ANNEALING

(71) Applicant: International Business Machines Corporation, Armonk, NY (US)

(72) Inventors: Nicolas L. Breil, Wappingers Falls, NY (US); Oleg Gluschenkov, Tannersville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/132,002

(22) Filed: Dec. 18, 2013

(65) Prior Publication Data

US 2015/0171178 A1 Jun. 18, 2015

(51) Int. Cl.
| H01L 21/44 | (2006.01) |
| H01L 29/45 | (2006.01) |
| H01L 21/285 | (2006.01) |
| H01L 21/321 | (2006.01) |
| H01L 21/3205 | (2006.01) |
| H01L 21/324 | (2006.01) |

(52) U.S. Cl.
CPC .......... *H01L 29/45* (2013.01); *H01L 21/28518* (2013.01); *H01L 21/321* (2013.01); *H01L 21/324* (2013.01); *H01L 21/32051* (2013.01)

(58) Field of Classification Search
USPC ......... 438/682, 581, 583, 630, 649, 651, 655, 438/644, 721, 755
See application file for complete search history.

(56) References Cited

U.S. PATENT DOCUMENTS

| 5,937,325 | A | 8/1999 | Ishida |
| 6,905,922 | B2 | 6/2005 | Lin et al. |
| 7,544,575 | B2 | 6/2009 | Adetutu et al. |
| 7,678,694 | B2 | 3/2010 | Wang et al. |
| 7,745,890 | B2 | 6/2010 | Yu et al. |
| 7,861,406 | B2 | 1/2011 | Lodha et al. |
| 2005/0158996 | A1* | 7/2005 | Kim et al. ..................... 438/664 |
| 2006/0163670 | A1 | 7/2006 | Ellis-Monaghan et al. |
| 2007/0123042 | A1 | 5/2007 | Rim et al. |
| 2008/0145984 | A1* | 6/2008 | Ke et al. ........................ 438/197 |
| 2011/0097884 | A1* | 4/2011 | Visokay et al. ............... 438/586 |
| 2011/0147855 | A1 | 6/2011 | Joshi et al. |
| 2012/0190163 | A1 | 7/2012 | Chen et al. |

* cited by examiner

*Primary Examiner* — Timor Karimy
(74) *Attorney, Agent, or Firm* — Scully, Scott, Murphy & Presser, P.C.; Yuanmin Cai (57) ABSTRACT

The embodiments of the present invention relate generally to the fabrication of integrated circuits, and more particularly to a structure and method for fabricating more particularly to a structure and method for fabricating silicides with different compositions and/or thicknesses on a single structure having more than one type of device using laser annealing. A method is disclosed that includes using a photoresist compatible with a laser annealing process to protect a region of a semiconductor substrate from silicide formation.

8 Claims, 11 Drawing Sheets

DUAL SILICIDE INTEGRATION WITH LASER ANNEALING

BACKGROUND

The present invention relates generally to semiconductor device manufacturing, and more particularly to a structure and method for fabricating a silicide on a device using laser annealing.

The use of silicides is well known in the field of semiconductor manufacturing. A silicide is a silicon metal alloy, typically composed of a transition metal including, for example, nickel (Ni), platinum (Pt), palladium (Pd), titanium (Ti), tungsten (W), tantalum (Ta), cobalt (Co), or alloys thereof. Silicides are commonly used to provide low resistivity structures for contacting the gate electrode and the source-drain electrodes in metal oxide semiconductor (MOS) devices. The transition metals have many desirable characteristics for use in silicides: they exhibit low electrical resistivity, react with silicon at relatively low temperatures, and do not react with most dielectrics.

Unfortunately, none of the transition metals are ideal for every application. For example, using nickel silicide (NiSi) in source-drain regions can be problematic because nickel silicide can spike (i.e., continue to react past a desirable point) to form $NiSi_2$ in p+ active regions, as well as encroach under gate spacers and gate electrodes. Even variations in the concentration of a metal in a silicide can cause problems in a device. For example, while a nickel silicide containing, for example, 10 atomic percent of platinum ($Ni_{0.90}Pt_{0.10}$), is suitable for use in one device, such as logic transistors, it can create leakage issues in another device, such as an eDRAM access transistor, as a result of thermal annealing steps used during the back end of the line (BEOL) processing of the chip. Conversely, while a silicide containing an increased concentration of platinum, for example, 15 atomic percent of platinum ($Ni_{0.85}Pt_{0.15}$), can be suitable for eDRAM access transistors, it can create some silicide encroachment issues on logic transistors.

Typically, these issues are circumvented by forming multiple silicides on a device. Common techniques used to form multiple silicides on a single structure can involve depositing an insulating layer and a hardmask over a specific region to prevent silicide formation in that region, or using a selective etch to expose a specific region for silicide formation. These techniques can require multiple processing steps that can cause defects in the multiple silicides. Accordingly, it may be desirable to overcome the deficiencies and limitations described hereinabove.

SUMMARY

According to one embodiment of the present invention, a method is disclosed. The method can include: forming a first photoresist layer on a first device formed on a semiconductor substrate, forming a metal layer over a second device formed on the semiconductor substrate, and forming a first silicide on a source-drain region of the second device using an annealing process. The first photoresist layer can be composed of a resist material able to withstand a post-exposure bake (PEB) temperature ranging from approximately 70° C. to approximately 115° C. for approximately 60 seconds.

According to another embodiment of the present invention, another method is disclosed. The method can include: forming a first photoresist layer on a first device formed on a semiconductor substrate, forming a first metal layer on a second device formed on a semiconductor substrate, forming a first silicide on a source-drain region of the second device using a laser annealing process, removing unreacted portions of the first metal layer, removing the first photoresist layer, forming a second metal layer on the first device and on the second device, and forming a second silicide on a source-drain region of the first device using the laser annealing process. The first photoresist layer can be composed of a resist material able to withstand a post-exposure bake (PEB) temperature ranging from approximately 70° C. to approximately 115° C. for approximately 60 seconds. The laser annealing process can involve subjecting a portion of the semiconductor substrate to a laser beam having a power ranging from approximately 100 W to approximately 800 W for a duration ranging from approximately 0.5 ms to approximately 500 ms. The method might further include forming a second photoresist layer on the second device before forming the second metal layer. The second photoresist layer can be composed of a resist material able to withstand a post-exposure bake (PEB) temperature ranging from approximately 70° C. to approximately 115° C. for approximately 60 seconds.

According to another embodiment of the present invention, a method is disclosed. The method can include forming a silicide in a first region of a semiconductor substrate using a photoresist layer to protect a second region of the semiconductor substrate from silicide formation. The photoresist layer can be composed of a resist material compatible with an annealing process.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that can be embodied in various forms. This invention can, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention can be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements can also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements can be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The embodiments of the present invention relate to semiconductor device manufacturing, and more particularly to a structure and method for fabricating silicides with different compositions and/or thicknesses on a single structure having more than one type of device using laser annealing. Embodiments by which to reduce processing steps and improve silicide quality when forming multiple silicides over at least two distinct gate devices is described in detail below with reference to the accompanying drawings FIGS. 1-11. One embodiment is described in detail below with reference to the accompanying drawings FIGS. 1-5. Another embodiment incorporates FIGS. 1-5 and is described in detail below with reference to the accompanying drawings FIGS. 6-8. Yet another embodiment incorporates FIGS. 1-5 and is described in detail below with reference to the accompanying drawings FIGS. 9-11.

One embodiment, in which a silicide is formed over only one device on a semiconductor substrate is described in detail below with reference to FIGS. 1-5.

Figure 1:
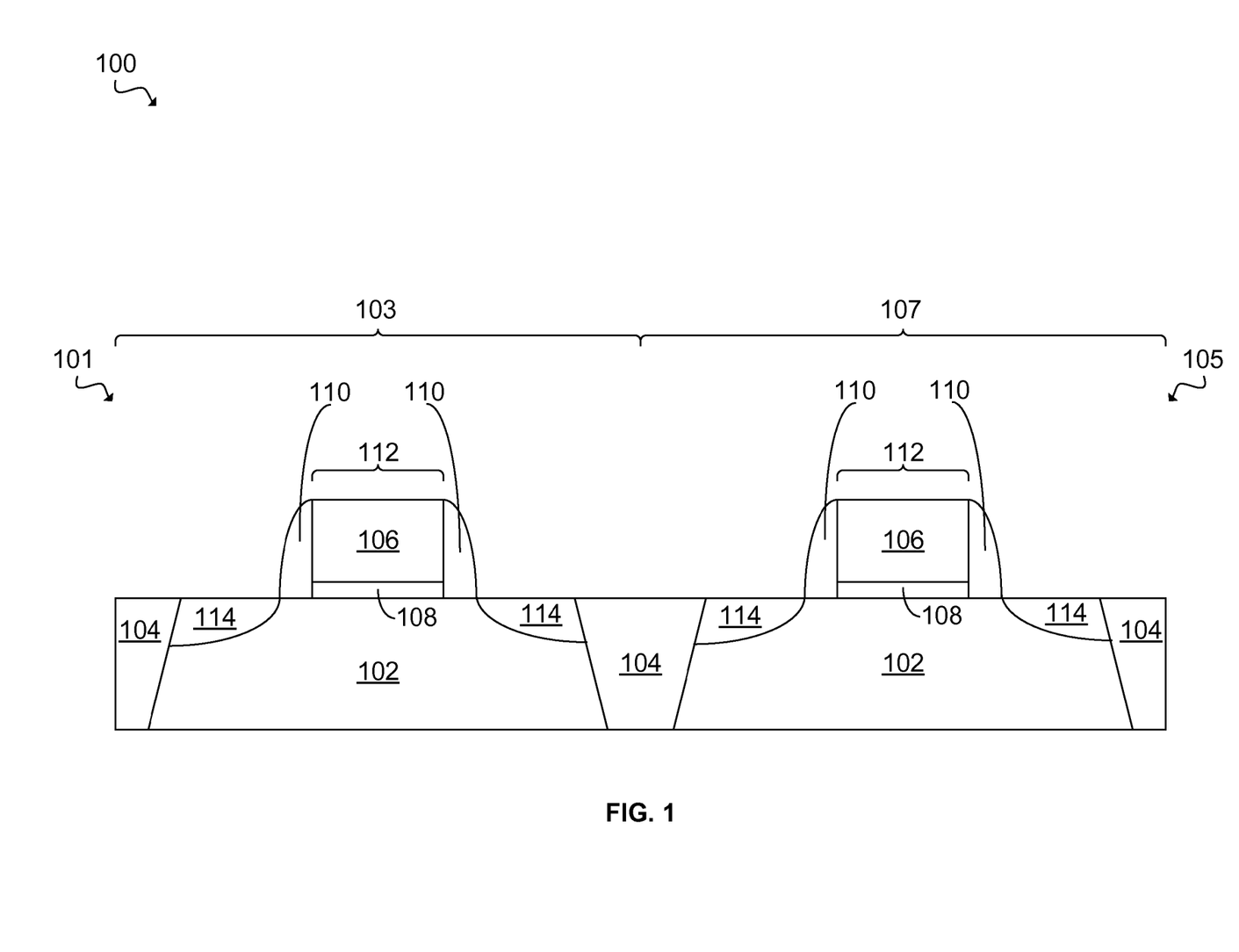
FIG. 1 is a cross sectional view illustrating a semiconductor substrate having a first device and a second device, according to an embodiment of the present invention.

Referring now to FIG. 1, a structure 100 is illustrated. Structure 100 can have a first device 101 present in a first region 103 of a semiconductor substrate 102 and a second device 105 present in an adjacent second region 107 of the semiconductor substrate 102. In one embodiment, the structure 100 can be part of a larger integrated circuit (IC). The first device 101 can include structures not present in the second device 105 and can have a different functionality in the IC. In one embodiment, the first device 101 can be an access transistor in an embedded dynamic random access memory ("eDRAM") and the second device 105 can be a logic transistor.

In one embodiment, the semiconductor substrate 102 can be a bulk semiconductor substrate made from any of several known semiconductor materials such as, for example, Si, strained Si, Ge, SiGe, Si:C, SiGeC, Si alloys, Ge alloys, and compound (e.g. III-V and II-VI) semiconductor materials. Non-limiting examples of compound semiconductor materials include GaAs, InAs, and InP, or any combination thereof. The semiconductor substrate 102 can be approximately, but is not limited to, several hundred microns thick. For example, the semiconductor substrate 102 can have a thickness ranging from approximately 0.5 mm to approximately 1.5 mm.

Although not depicted in FIG. 1, the semiconductor substrate 102 can also be a semiconductor on insulator (SOI) substrate. SOI substrates are typically composed of at least an SOI layer overlying a dielectric layer, often referred to as a buried dielectric layer. A base semiconductor layer can be present below the dielectric layer. The SOI layer and the base semiconductor layer can be composed of similar materials as the bulk semiconductor substrate described above. The buried dielectric layer can be formed by implanting a high-energy dopant into a bulk semiconductor substrate, and then annealing the structure to form a buried oxide layer. In another embodiment, the buried dielectric layer can be deposited or grown prior to the formation of the SOI layer. In yet another embodiment, the SOI substrate can be formed using wafer-bonding techniques, where a bonded wafer pair is formed using glue, an adhesive polymer, or direct bonding. The buried dielectric layer can have a thickness ranging from approximately 100 to approximately 500 nm thick. The SOI layer can have a thickness similar to the buried dielectric layer and the base semiconductor layer can have a thickness ranging from approximately 0.5 mm to approximately 1.5 mm.

The first region 103 and the second region 107 can be separated by an isolation region 104 present in the semiconductor substrate 102. The isolation region 104 can be formed by any isolation technology known in the art, such as local oxidation of silicon (LOCOS), mesa isolation, or shallow trench isolation (STI). In one embodiment, the isolation region 104 can include an STI structure. In another embodiment, the isolation region 104 can be composed of an oxide, nitride, oxynitride, fluoride-doped silicate glass (FSG), a low-k dielectric material, and/or combinations thereof. In another embodiment, the isolation region 104 can be a multi-layered structure composed of a thermal oxide liner layer and silicon nitride or silicon oxide filler.

The first device 101 and the second device 105 can both include a gate 112 on the semiconductor substrate 102. The gate 112 can include a gate conductor 106 and a gate dielectric 108. The gate 112 can be formed by depositing a gate dielectric layer (not shown) on the semiconductor substrate 102, and then depositing a gate conductor layer (not shown) on the gate dielectric layer (not shown). The gate dielectric layer (not shown) and the gate conductor layer (not shown) can then be patterned and etched by any conventional photolithography process to form the gate 112. In one embodiment, a sacrificial dummy gate structure can be formed and the gate 112 can be formed later by a replacement gate process. In one embodiment, a dielectric cap (not shown) can be formed on an upper surface of the gate conductor 106. The dielectric cap (not shown) can be formed by depositing a dielectric hardmask material, such as SiN or $SiO_2$, atop the gate conductor 106 using any conventional photolithography process.

In one embodiment, the gate dielectric 108 can be an oxide, nitride, or oxynitride of silicon. In another embodiment, the gate dielectric 108 can be composed of a high-k dielectric material. A high-k dielectric material has a dielectric constant higher than the dielectric constant of silicon dioxide ($SiO_2$), approximately 4.0. High-k dielectric materials suitable for the gate dielectric 108 can include, but are not limited to, hafnium oxides, hafnium silicates, titanium oxides, barium-strontium-titanates (BSTs), and lead-zirconate-titanates (PZTs). The gate dielectric 108 can be formed using any of several deposition methods, including, for example chemical vapor deposition (CVD) and physical vapor deposition (PVD). In one embodiment, the gate dielectric 108 can have a thickness ranging from approximately 1 nm to approximately 20 nm.

The gate conductor 106 can be composed of conductive materials including, but not limited to, metals, metal alloys, metal nitrides, metal silicides, as well as laminates and composites thereof. In one embodiment, the gate conductor 106 can be any conductive material including, but not limited to: W, Ni, Ti, Mo, Ta, Cu, Pt, Ag, Au, Ru, Ir, Rh, Re, and alloys that include at least one of the aforementioned materials. The gate conductor 106 can also be composed of doped polysilicon and/or polysilicon-germanium alloy materials having a dopant concentration ranging from approximately $1\times10^{18}$ $cm^{-3}$ to approximately $1\times10^{22}$ $cm^{-3}$. The gate conductor 106 can also be composed polycide materials of doped polysilicon/metal silicide stack materials. In another embodiment, the gate conductor 106 can be composed of amorphous silicon or polycrystalline silicon.

The gate conductor 106 can be formed using conventional deposition methods including, but not limited to, salicide methods, atomic layer deposition (ALD), CVD, PVD, evaporation, and sputtering. In an embodiment, the gate conductor 106 can be a multi-layered structure containing more than one conductive material. The gate conductor 106 can have a height ranging from approximately 10 nm to approximately 200 nm. In one embodiment, the gate conductor 106 can have a height ranging from approximately 30 nm to approximately 150 nm. The gate 112 can have a width of approximately 20 nm to approximately 40 nm.

The first device 101 and the second device 105 can both include gate spacers 110 on the semiconductor substrate 102 adjacent to and contacting the gate 112. The gate spacers 110 can be composed of an insulator such as a nitride, oxide, oxynitride, and/or any combination thereof. In one embodiment, the gate spacers 110 can include an oxide inner layer and a nitride outer layer. The gate spacers 110 can be formed by depositing the insulator by well known methods of deposition such as, but not limited to, CVD, plasma-enhanced CVD (PECVD), metal organic chemical vapor deposition (MOCVD), ALD, evaporation, reactive sputtering, chemical solution deposition, and other like processes. After deposition, the insulator can undergo an etching process such as, but not limited to, reactive ion etching (RIE), anisotropic etching, and/or a planarization process such as chemical mechanical planarization (CMP) so that the insulator is removed from horizontal surfaces of the structure 100, leaving the gate spacers 110 present on the vertical sidewalls of the gate 102. In one embodiment, the gate spacers 110 can have a width of approximately 3 nm to approximately 20 nm at their widest point.

The first device 101 and the second device 105 can each include source-drain regions 114. In one embodiment, the source-drain regions 114 can be doped regions of the semiconductor substrate 102, as illustrated in the figures. In another embodiment, the source-drain regions 114 can be formed on the surface of the semiconductor substrate 102 as raised source-drain (RSD) regions.

In one embodiment, the source-drain regions 114 can be doped with a p-type conductivity dopant. The source-drain regions 114 can be doped using a conventional deposition process such as, for example, epitaxial growth or ion implantation. The epitaxial growth process can include depositing Si, Ge, and C for stress engineering of the device channel. Examples of p-type dopants that can be used include, but are not limited to, elements from Group III of the Periodic Table of Elements, such as boron, aluminum, gallium, indium, or alloys thereof. In one embodiment, the p-type dopant concentration can range from approximately $1\times10^{19}$ atoms/$cm^3$ to approximately $5\times10^{21}$ atoms/$cm^3$.

Alternatively, the source-drain regions 114 can be doped with an n-type conductivity dopant. The source-drain regions 114 can be doped using a conventional deposition process such as, for example, epitaxial growth or ion implantation. The epitaxial growth process can include depositing Si, Ge, and C for stress engineering of the device channel. Examples of n-type dopants that can be used include, but are not limited to, elements from Group V of the Periodic Table of Elements, such as phosphorus, antimony, arsenic, or alloys thereof. In one embodiment, the n-type dopant concentration can range from approximately $1\times10^{19}$ atoms/$cm^3$ to approximately $5\times10^{21}$ atoms/$cm^3$.

It should be noted that the source-drain regions 114 of a particular device can typically be either p-doped or n-doped, but not both. For example, the first device 101 can include p-doped source-drain regions 114, and the second device 105 can include n-doped source-drain regions 114.

Figure 2:
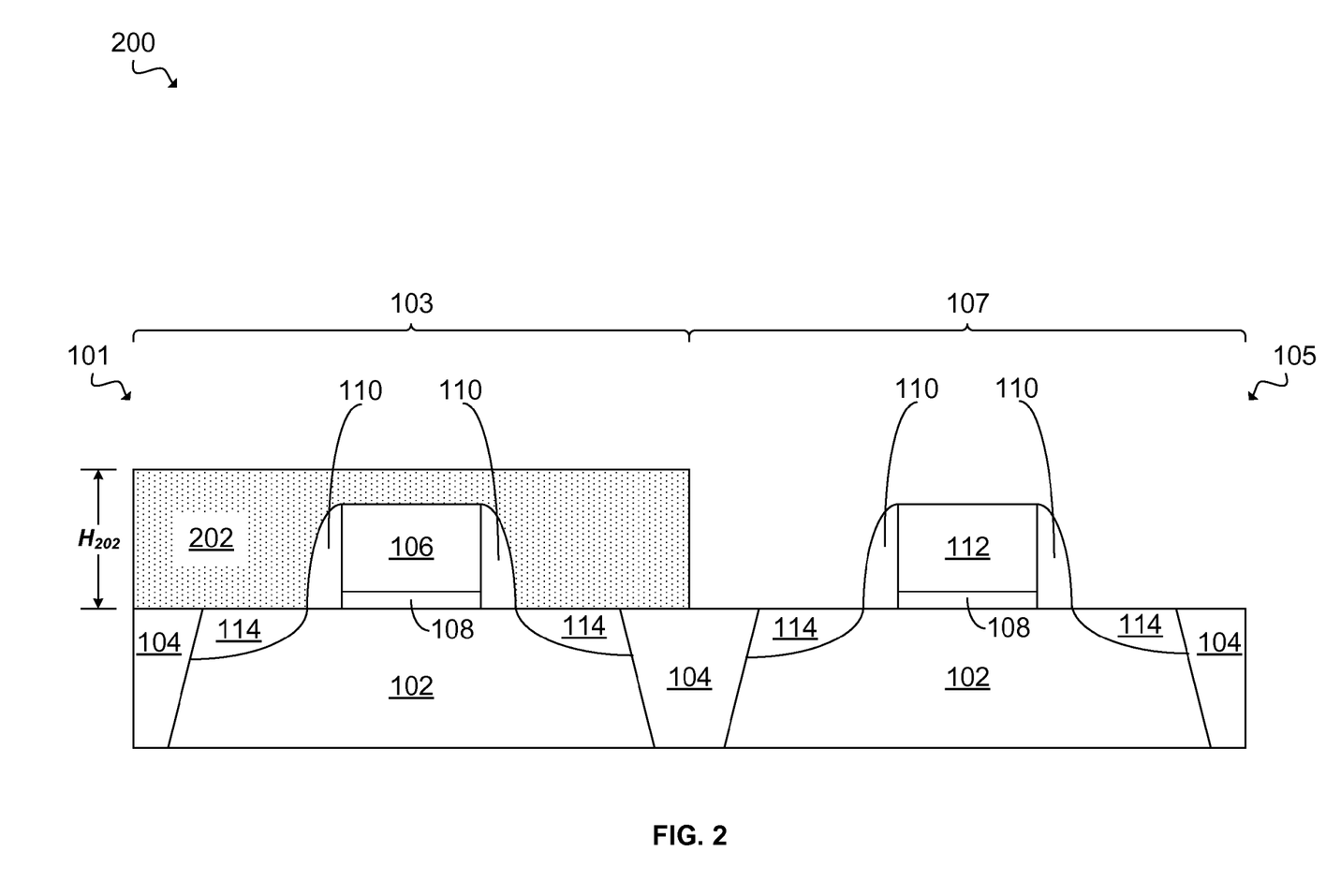
FIG. 2 is a cross sectional view illustrating forming a first photoresist layer on the first device, according to an embodiment of the present invention.

Referring now to FIG. 2, a structure 200 is shown. FIG. 2 illustrates forming a first photoresist layer 202 on the first device 101 in the first region 103. The first photoresist layer 202 can be formed by any typical deposition technique, such as, a resist spin coating technique, CVD, PECVD, MOCVD, ALD, evaporation, reactive sputtering, chemical solution deposition, and other like processes. In one embodiment, the first photoresist layer 202 can be formed by a blanket deposition over both the first region 103 and the second region 107, and then can be patterned using photolithography so that it only covers the first device 101 in the first region 103. In an embodiment in which the first photoresist layer 202 is a negative tone development (NTD) resist, it can be patterned by exposing only the portion that is to remain, thereby making it insoluble to the photoresist developer. The exposed portion of the first photoresist layer 202 can remain on the device. In an embodiment in which the first photoresist layer 202 is a positive tone development (PTD) resist, it can be patterned by exposing only the portion of the resist that is to be removed, thereby making it soluble to the photoresist developer. The unexposed portion of the first photoresist layer 202 can remain on the device.

The first photoresist layer 202 can be composed of a commercially available photoresist including, but not limited, to a resist manufactured by Tokyo Ohka Kogyo Co., Ltd. and sold under the name Pi6-133ME™, a resist manufactured by Sumika Electronic Materials and sold under the name PAR1003-S48™, a resist manufactured by Japan Synthetic Rubber Corporation and sold under the name AIM8356™, and a resist manufactured by Shin-Etsu Chemical Co., Ltd. and sold under the name SAILX206™. The first photoresist layer 202 can be composed of a resist having a post-exposure bake (PEB) temperature ranging from approximately 70° C. to approximately 115° C. for approximately 60 seconds and an optical path length (OPL) ranging from approximately 80 nm to approximately 155 nm. The first photoresist layer 202 can have a height $H_{202}$ ranging from approximately 75 nm to approximately 125 nm.

Figure 3:
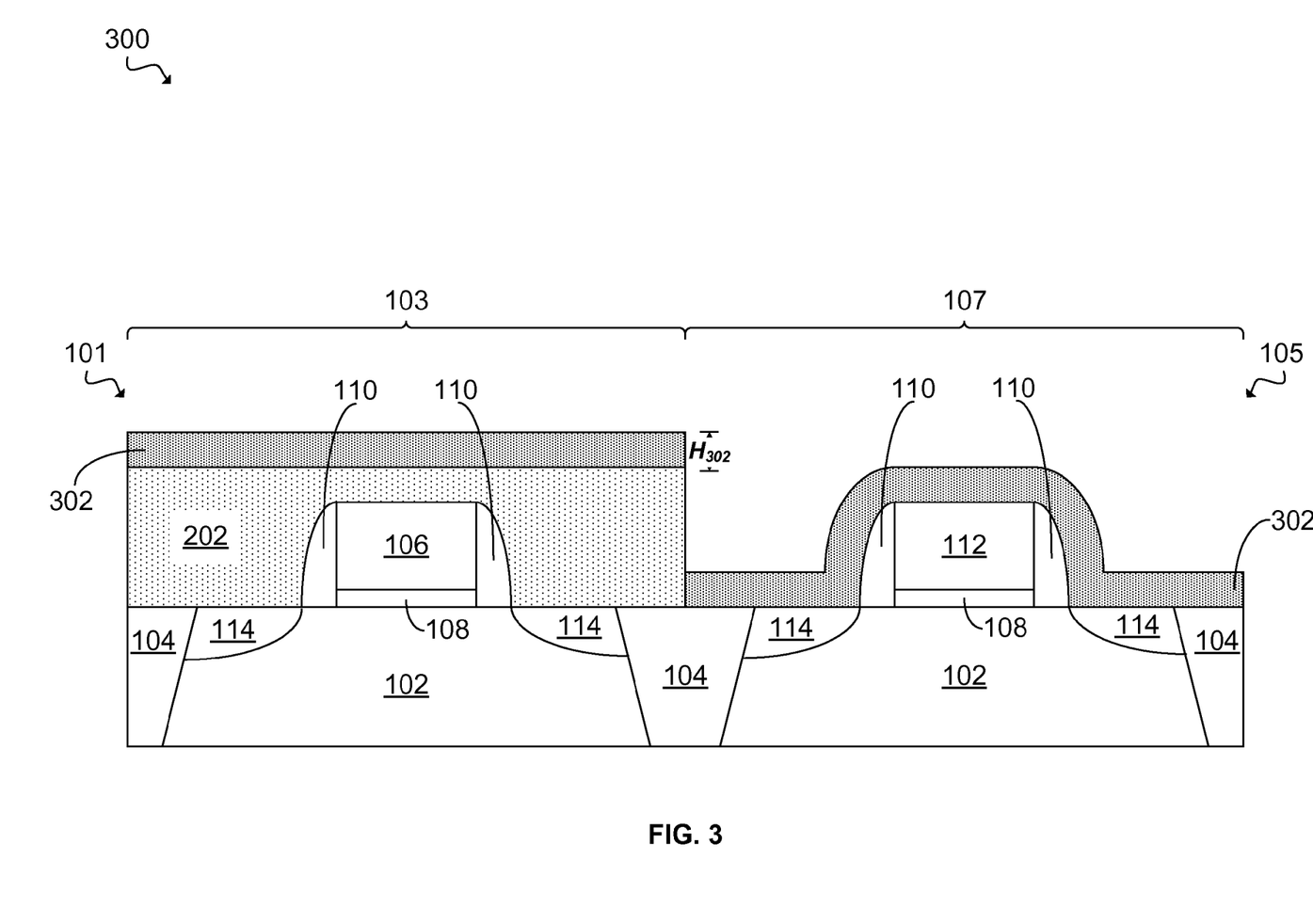
FIG. 3 is a cross sectional view illustrating forming a first metal layer on the first photoresist layer and the second device.

Referring now to FIG. 3, a structure 300 is shown. FIG. 3 illustrates forming a first metal layer 302 on the first photoresist layer 202 and the second device 105 in the second region 107. The first metal layer 302 can be formed using conventional deposition techniques compatible with the resist material of the first photoresist layer 202 including, but not limited to: CVD, PECVD, high-density CVD (HDCVD), physical vapor deposition (PVD), plating, sputtering, evaporation, and chemical solution deposition. In one embodiment, the first metal layer 302 can be formed by any conventional low temperature deposition technique known at the art, preferably at temperatures below approximately 200° C. so as to not degrade the first photoresist layer 202. The first metal layer 302 can have a height $H_{302}$ ranging from approximately 2 nm to approximately 30 nm.

In one embodiment, the first metal layer 302 can be composed of a transition metal such as, but not limited to, nickel (Ni), cobalt (Co), platinum (Pt) palladium (Pd), titanium (Ti), tantalum (Ta), tungsten (W), rhenium (Re), ruthenium (Ru), and rhodium (Rh). In yet another embodiment, the first metal layer 302 can be composed of a metal alloy, such as, but not limited to nickel platinum (NiPt), nickel palladium (NiPd), nickel rhenium (NiRe), titanium tantalum (TiTa), and titanium niobium (TiNb). In yet another embodiment, the first metal layer 302 can be composed of multiple layers including, but not limited to, a first layer of containing a transition metal, such as Ni, and a second layer containing a nitride, such as TiN or TaN, to serve as an oxidation barrier layer. The oxidation barrier layer can have a height ranging from approximately 1 nm to approximately 20 nm.

Figure 4:
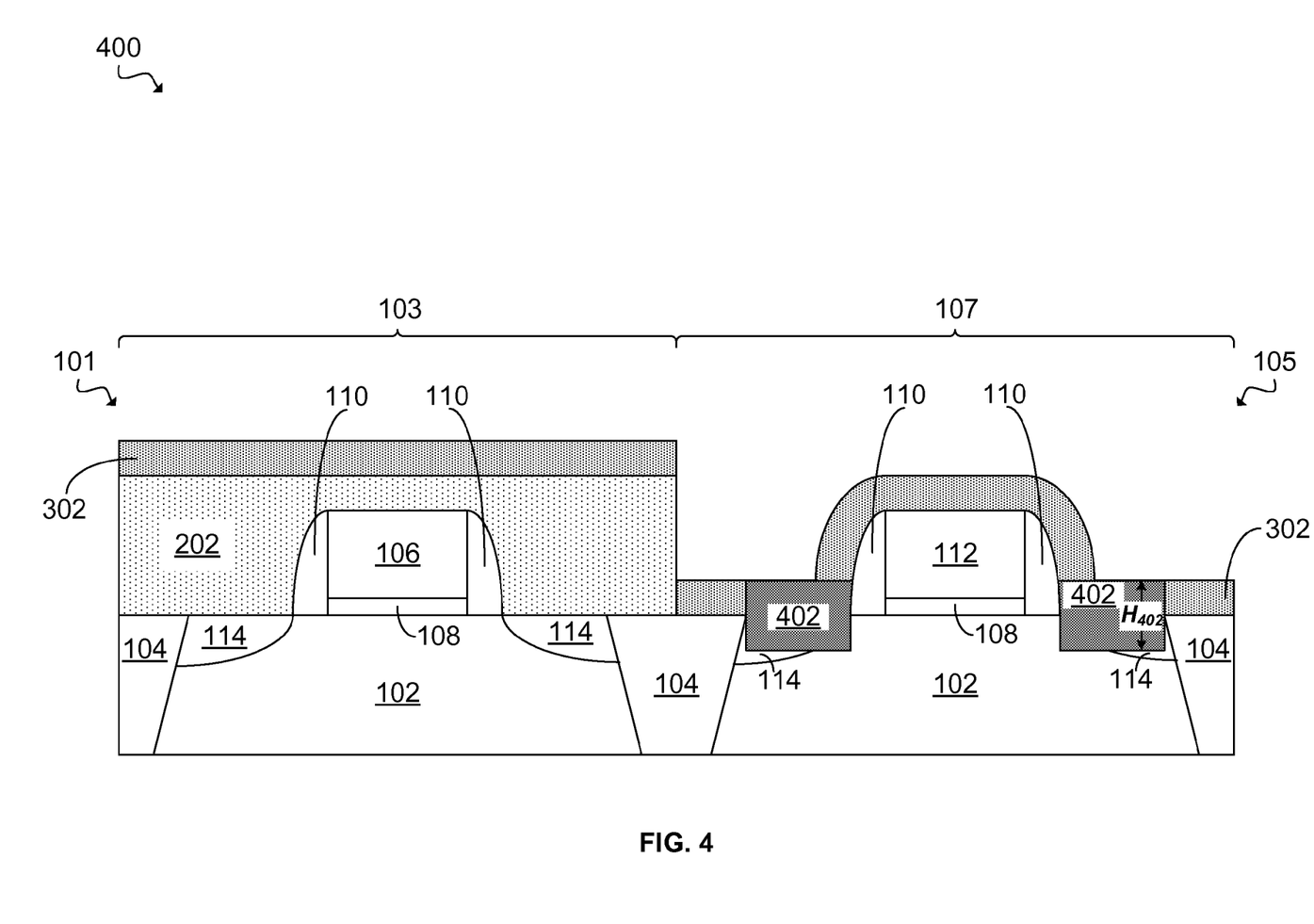
FIG. 4 is a cross sectional view illustrating performing an annealing process to form second region silicides, according to an embodiment of the present invention.

Referring now to FIG. 4, a structure 400 is shown. FIG. 4 illustrates performing an annealing process to form second region silicides 402 on, and incorporating, the source-drain regions 114 of the second device 105 in the second region 107. During the annealing process, the first metal layer 302 can react with the silicon present in the source-drain regions 114 in the second region 107 to form the second region silicides 402. In one embodiment, the second region silicides 402 can be adjacent to and contacting the gate spacers 110 as well as the isolation region 104.

In one embodiment, a rapid thermal annealing (RTA) process compatible with the resist material of the first photoresist layer 202 can be used. The RTA process can be performed at low temperature, preferably below approximately 200° C., so as not to degrade/disturb the first photoresist layer 202. In another embodiment, a laser annealing process, such as nanosecond laser annealing or laser spike Annealing™ (Ultratech), can be used. One advantage of laser annealing is that a particular region of the device can be targeted and heated to the target temperature rapidly so that annealing of substances requiring a higher activation energy can be achieved in a shorter amount of time than other known annealing techniques. Laser annealing can also reduce the thermal cycle of the annealing process, resulting in less damage to the targeted device undergoing the anneal and surrounding areas, the ability to use a broader array of resists, as well as the ability to reduce the use of hardmasks.

The laser annealing can be performed using a dual laser beam process or a single laser beam process. In one embodiment, the laser annealing can be performed using a single laser beam having a power ranging from approximately 100 W to approximately 800 W. The long axis of the laser beam can have a size ranging from approximately 5 mm to approximately 20 mm. The short axis of the laser beam can have a size ranging from approximately 0.5 mm to approximately 2 mm. The laser annealing process can have a duration ranging from approximately 0.5 ms to approximately 10 ms. In one embodiment, the structure 400 can be placed on a chuck to secure it during the laser annealing. The chuck can be at room temperature, but can be heated to temperatures compatible with the resist material of the first photoresist layer 202 (less than approximately 200° C.). The laser annealing can be performed in an inert gas environment, which can include helium (He), argon (Ar), nitrogen ($N_2$), or another forming gas. The laser annealing process can be terminated by lowering the surrounding temperature of the entire structure to below a temperature of approximately 100° C. within a time period of approximately 1 seconds to approximately 30 seconds.

The composition of the second region silicides 402 can depend on the composition of the first metal layer 302. Examples of compositions of the second region silicides 402 include, but are not limited to, nickel silicide ($NiSi_x$), nickel platinum silicide ($NiPt_ySi_x$), cobalt silicide ($CoSi_x$), tantalum silicide ($TaSi_x$), and titanium silicide ($TiSi_x$). The second region silicides 402 can have a height $H_{402}$ ranging from approximately 5 nm to approximately 40 nm.

Figure 5:
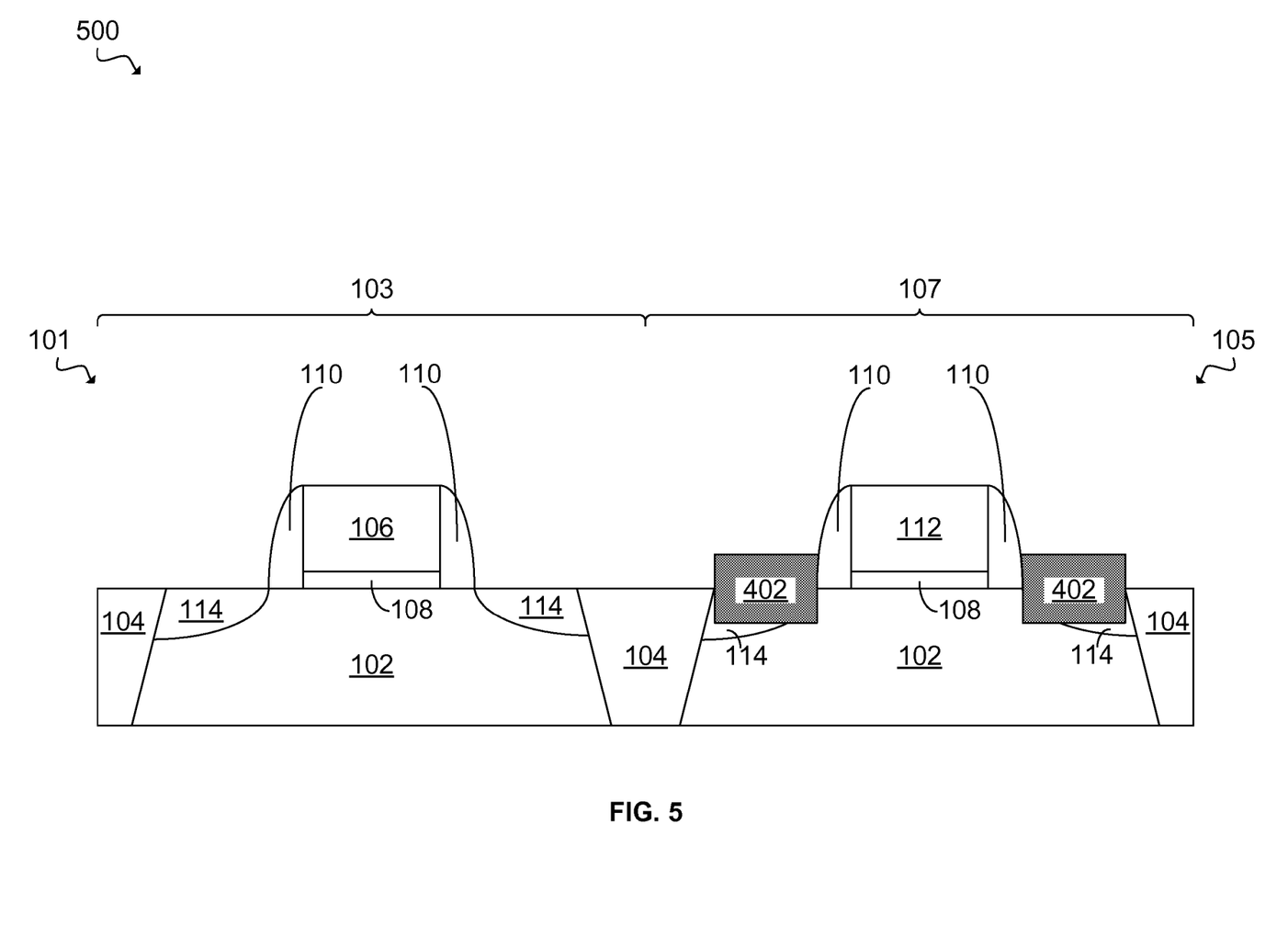
FIG. 5 is a cross sectional view illustrating removing unreacted portions of the first metal layer followed by removing the first photoresist layer, according to an embodiment of the present invention.

Referring now to FIG. 5, a structure 500 is shown. FIG. 5 illustrates removing unreacted portions the first metal layer 302 (FIG. 4) followed by removing the first photoresist layer 202 (FIG. 4). In one embodiment, an etching process can be carried out to remove substantially all unreacted portions of the first metal layer 302 (FIG. 4). In other words, the etching process can remove substantially all portions of the first metal layer 302 (FIG. 4) that did not form a silicide. The etching process can leave the second region silicides 402 intact. In one embodiment, the etching process can be carried out by using an etching solution that contains one or more oxidizers such as, for example, sulfuric peroxide, hydrogen peroxide, sulfuric acid, potassium permanganate, hydrochloric acid, ferric chloride, persulfate (e.g., ammonium persulfate, sodium persulfate, or potassium persulfate), nitric acid, a ceric compound (such as, for example, ceric ammonium nitrate), or some combination thereof. The first photoresist layer 202 (FIG. 4) can be removed in a similar fashion using known techniques.

In one embodiment, an optional second annealing process can be performed after the unreacted portions of the first metal layer 302 (FIG. 4) and the first photoresist layer 202 (FIG. 4) are removed. The optional second annealing process can be used to complete the formation of the second region silicides 402. In embodiments in which the first metal layer 302 (FIG. 4) is composed of multiple layers, the oxidation barrier layer as well as unreacted portions of the transition metal in the first layer can be removed before the second anneal. The structure can be subjected to the optional second annealing process at a higher temperate to continue the silicide reaction so that a monosilicide is formed. The optional second annealing process can be performed at a temperature ranging from approximately 300° C. to approximately 800° C.

In another embodiment, described below with reference to FIGS. 6-8, a second photoresist layer 602 and a second metal layer 604 can be deposited over the structure 500 (FIG. 5) to form first region silicides 702 in the first region 103 (FIG. 5). This embodiment, which incorporates FIGS. 1-5, is described in detail below.

Figure 6:
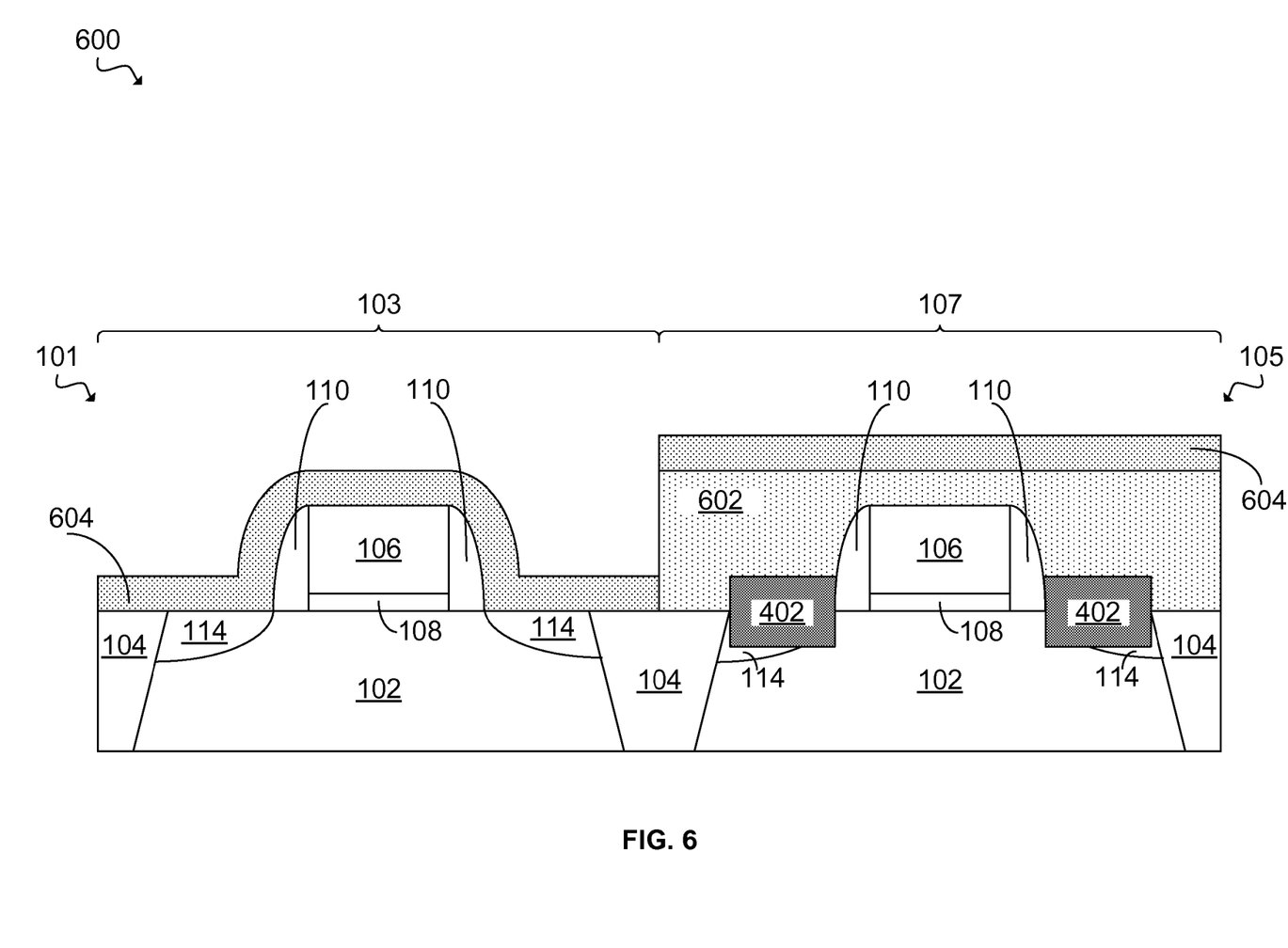
FIG. 6 is a cross sectional view illustrating forming a second photoresist layer and a second metal layer, according to an embodiment of the present invention.

Referring now to FIG. 6, a structure 600 is shown. FIG. 6 illustrates forming a second photoresist layer 602 and a second metal layer 604 over the structure 500 (FIG. 5). The second photoresist layer 602 can be formed over the second device 105 and the second region silicides 402 the second region 107. The second photoresist layer 602 can be substantially similar to the first photoresist layer 202 (FIG. 2) and formed using substantially similar techniques as those described above with reference to FIG. 2. The second metal layer 604 can be substantially similar to the first metal layer 302 (FIG. 3) and formed using substantially similar techniques as those described above with reference to FIG. 3.

Figure 7:
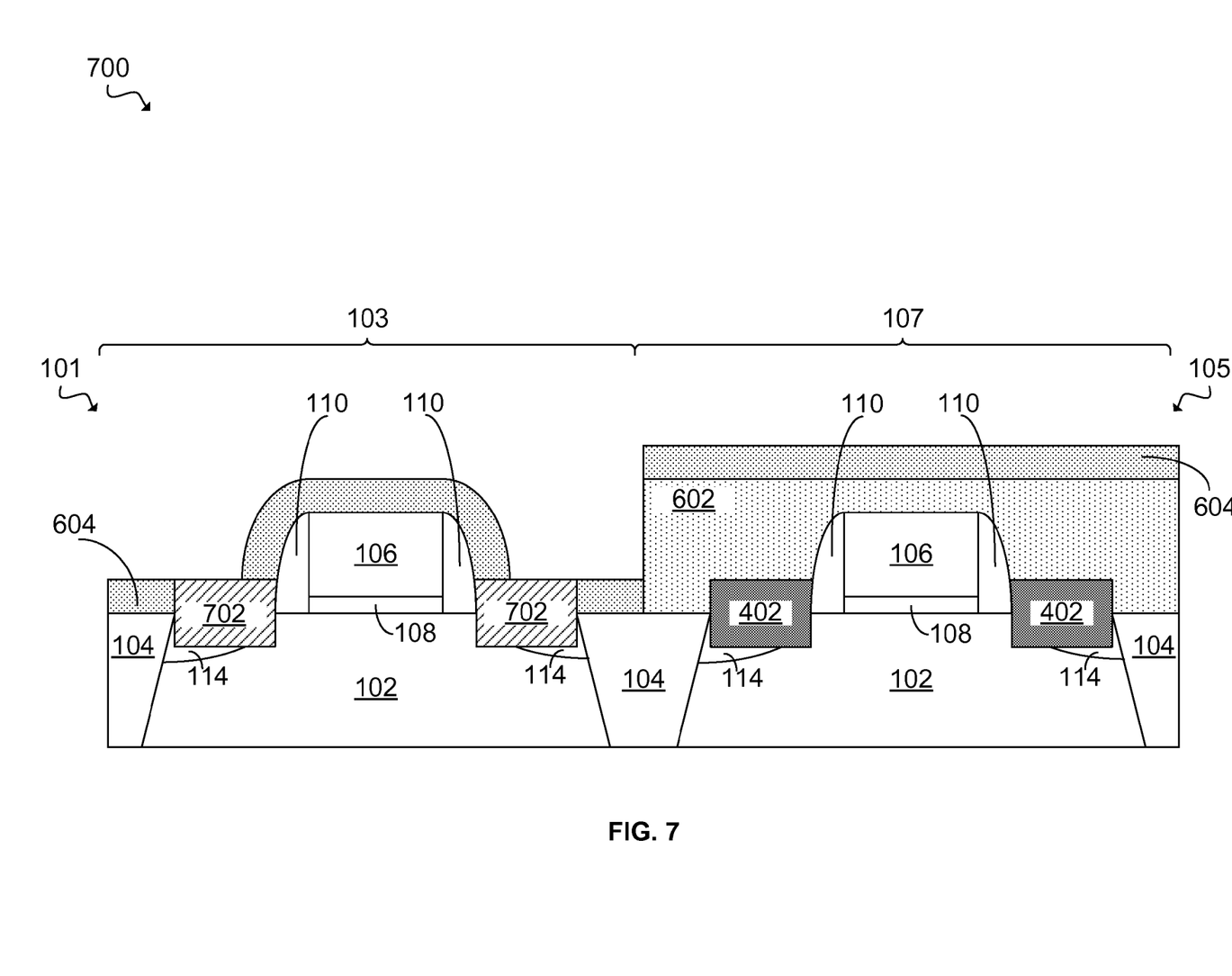
FIG. 7 is a cross sectional view illustrating performing an annealing process to form first region silicides, according to an embodiment of the present invention.

Referring now to FIG. 7, a structure 700 is shown. FIG. 7 illustrates performing an annealing process to form the first region silicides 702. The first region silicides 702 can be formed on, and can incorporate, the source-drain regions 114 of the first device 101 in the first region 103. In one embodiment, the first region silicides 702 can be adjacent to and contacting the gate spacers 110 as well as the isolation region 104. The first region silicides 702 can be substantially similar to the second region silicides 402 and formed using substantially similar techniques as those described above with reference to FIG. 4. In one embodiment, the first region silicides 702 can be composed of different metals than the second region silicides 402 and can have a different thickness. In another embodiment, the first region silicides 702 can be composed of the same metals as the second region silicides 402, but can have a different concentration of the metals and can have a different thickness. In yet another embodiment, the first region silicides 702 can have the same composition and concentration of metals as the second region silicides 402, but can have a different thickness.

Figure 8:
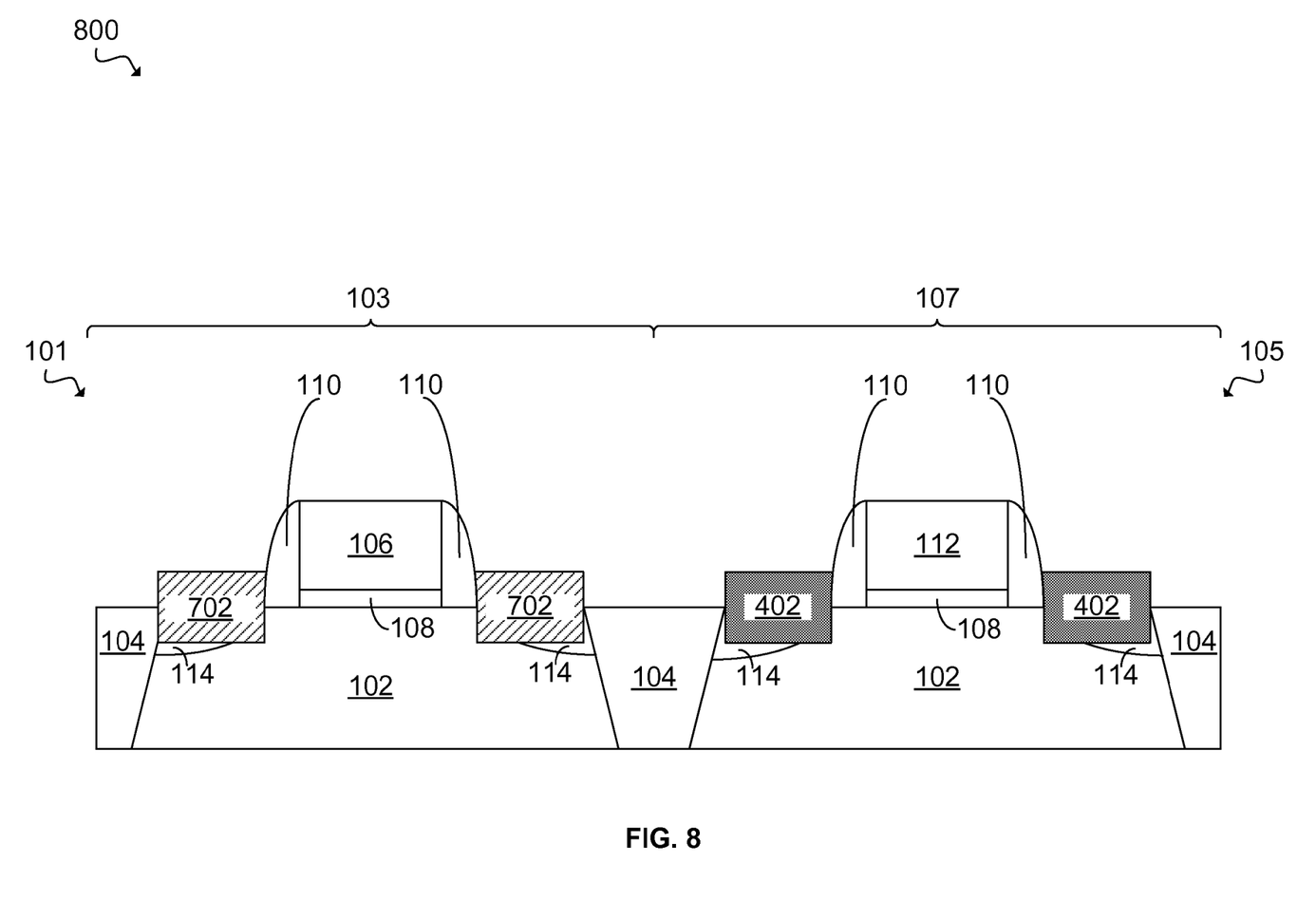
FIG. 8 is a cross sectional view illustrating removing unreacted portions of the second metal layer and then removing the second photoresist layer, according to an embodiment of the present invention.

Referring now to FIG. 8, a structure 800 is shown. FIG. 8 illustrates removing unreacted portions of the second metal layer 604 (FIG. 7) and then removing the second photoresist layer 602 (FIG. 7). The unreacted portions of the second metal layer 604 (FIG. 7) and the second photoresist layer 602 (FIG. 7) can be removed using substantially similar techniques as those used to remove the first metal layer 302 (FIG. 4) and the first photoresist layer 202 (FIG. 4) as described above with reference to FIG. 5. In one embodiment, like above a second annealing process can be performed after unreacted portions of the second metal layer 604 (FIG. 7) and the second photoresist layer 602 (FIG. 7) are removed to complete the formation of the first region silicides 702. The second annealing process can be substantially similar to the second annealing process described above with reference to FIG. 5.

In another embodiment, described below with reference to FIGS. 9-11, the second metal layer 604 can be deposited directly on the first device 101 and the second device 105, without protecting the second region silicides 402 of the second device 105 with the second photoresist layer 602 (FIG. 6), to form the first region silicides 702. This embodiment, which incorporates FIGS. 1-5, is described in detail below.

Figure 9:
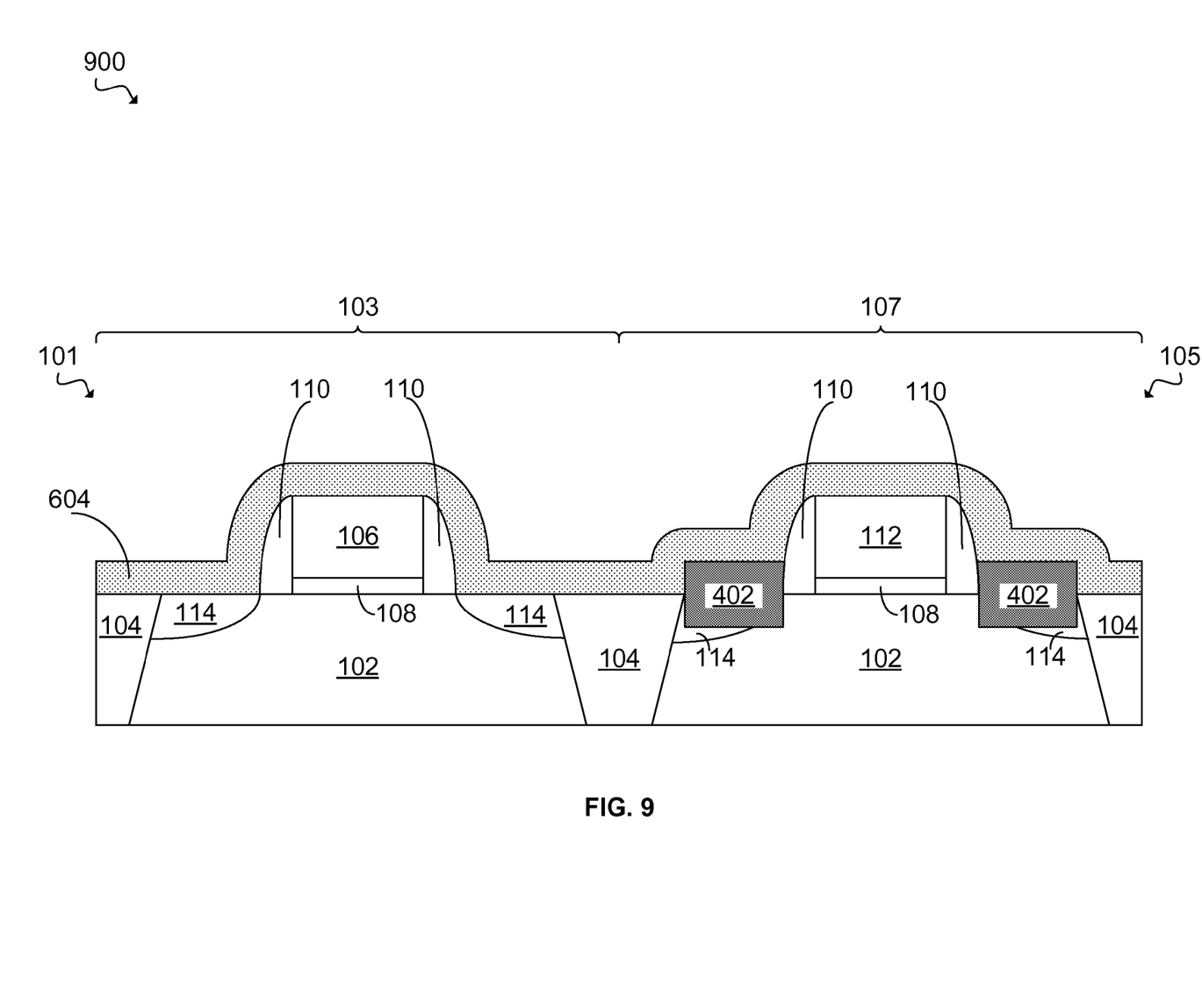
FIG. 9 is a cross sectional view illustrating forming the second metal layer on the first device and on the second device, according an embodiment of the present invention.

Referring now to FIG. 9, a structure 900 is shown. FIG. 9 illustrates forming the second metal layer 602 on the first device 101 in the first region 103 and on the second device 105 and second region silicides 402 in the second region 107.

Figure 10:
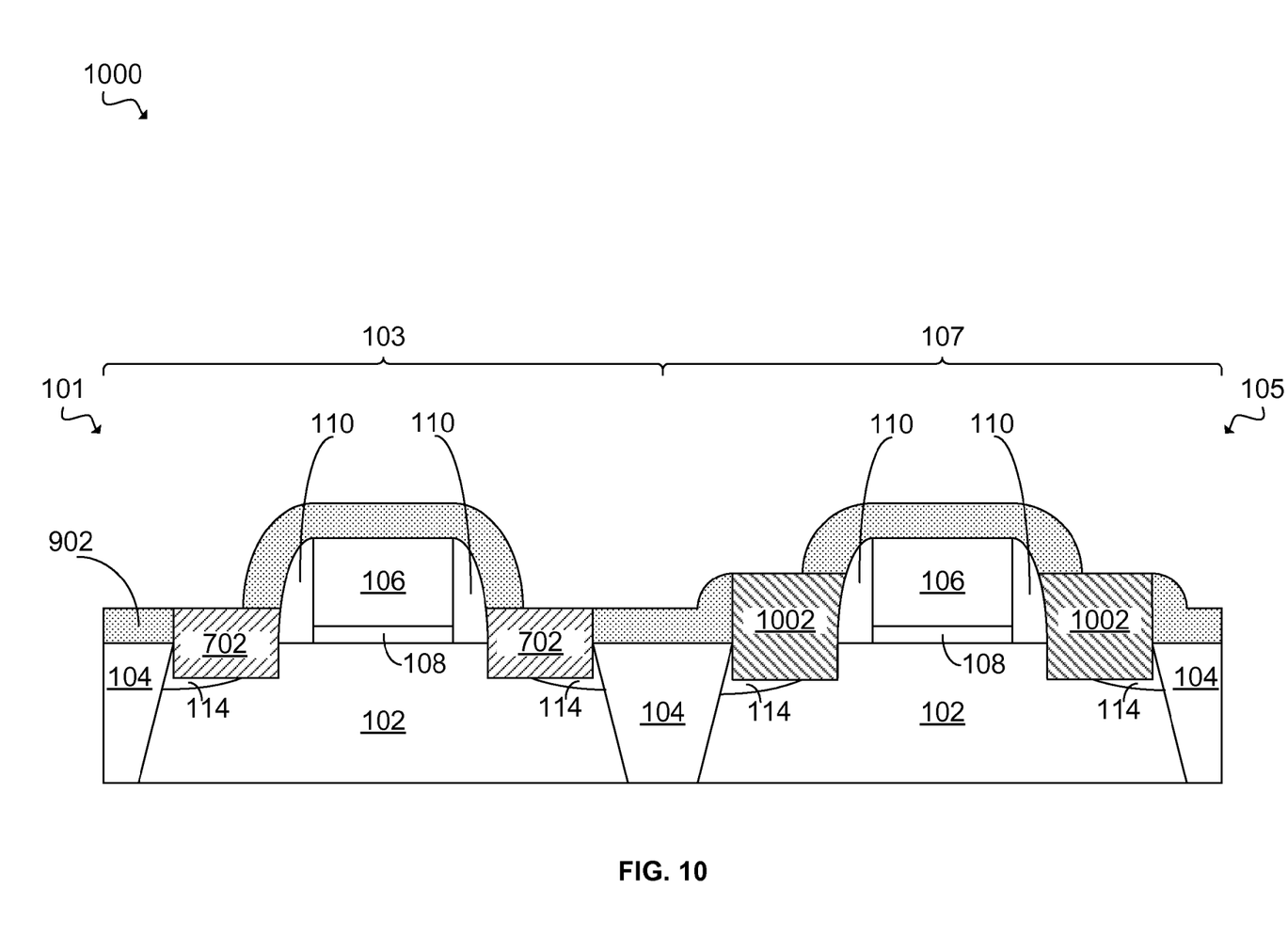
FIG. 10 is a cross sectional view illustrating performing an annealing process to form the first region silicides, according to an embodiment of the present invention.

Referring now to FIG. 10, a structure 1000 is shown. FIG. 10 illustrates performing an annealing process to form the first region silicides 702. In addition, because the second metal layer 602 can be in direct contact with the second region silicides 402 (FIG. 9), which can contain silicon, the annealing process can cause a silicide reaction between the metal layer 602 and the second region silicides 402 (FIG. 9). This silicide reaction can change the composition of metal in the second region silicides 402 (FIG. 9) to form alternate second region silicides 1002 In one embodiment, the alternate second region silicides 1002 can be composed of the same metal as the second region silicides 402 (FIG. 9) but can have an increased concentration of that metal. In another embodiment, the alternate second region silicides 1002 can have at least one additional metal present than the second region silicides 402 (FIG. 9). The alternate second region silicides 1002 can have a greater thickness than the second region silicides 402 (FIG. 9).

The alternate second region silicides 1002 can have a different composition than the first region silicides 702 and can have a different thickness. In another embodiment, the alternate second region silicides 1002 can be composed of the same metals as the first region silicides 702, but can have a different concentration of those metals as well as a different thickness. In yet another embodiment, the alternate second region silicides 1002 can have the same composition and concentration of metals as the first region silicides 702, but can have a different thickness.

Figure 11:
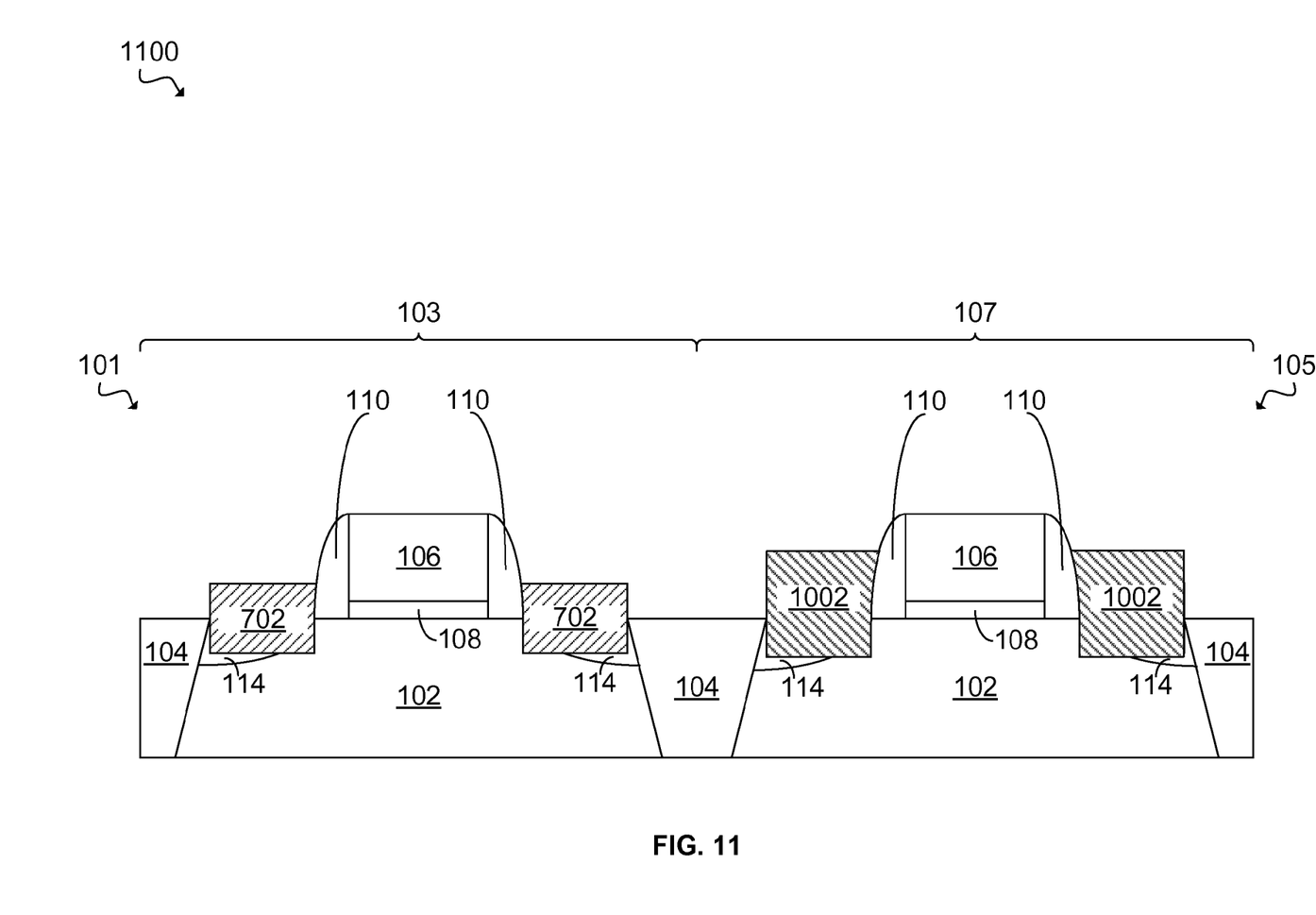
FIG. 11 is a cross sectional view illustrating removing the second metal layer, according to an embodiment of the present invention.

Referring now to FIG. 11, a structure 1100 is shown. FIG. 11 illustrates removing the second metal layer 602 (FIG. 10). The second metal layer 602 (FIG. 10) can be removed using substantially similar techniques as those used to remove the first metal layer 302 (FIG. 3) as described above in reference to FIG. 5. In one embodiment, a second annealing process can be performed after the second metal layer 602 (FIG. 10) is removed to complete the formation of the first region silicides 702. The second annealing process can be substantially similar to the second annealing process as described above in reference to FIG. 5.

It is contemplated that the above process steps can be carried out using a trench silicide process. In other words, a dielectric layer (not shown) can be deposited over the structure 100 (FIG. 1) before the annealing processes are performed. Trenches (not shown) can be etched in the dielectric layer (not shown) to expose portions of the structure 100 where a silicide is to be formed. The metal layers described above can then be formed in the trenches (not shown) and the annealing processes descried above can then be performed to form the silicides described above. After the silicides described above are formed, the dielectric layer (not shown) can then be removed.

As described above, embodiments of the present invention can reduce or eliminate the need for hardmask and etching based approaches to form more than one type of silicide on the same structure. The former approach can require additional thermal cycles and processing steps to form the hardmask that can damage the silicide formed first on the device. The latter approach can be difficult to control, can cause defects in the silicides, and can only be used with different metals due to the selective nature of the etch. The photoresists described above can provide an adequate masking material to selectively form silicides using laser annealing, or in one embodiment, a low temperature RTA process, because they can be compatible with the relatively low temperatures and times of these processes and remain stable. Typically, a more durable hardmask layer would be required to provide adequate protection during silicide formation. Hardmask formation and removal requires additional processing steps, including damaging thermal curing and etching processes. Embodiments of the present invention can reduce the amount of thermal cycles and etching processes that the devices undergo, thereby reducing damage to the device and improving silicide quality. In addition, embodiments of the present invention can allow for the formation of more than one silicide composed of the same metal, but with different concentrations, on the same structure without additional etching processes.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming a first photoresist layer over a first device formed on a semiconductor substrate;
    forming a metal layer over a second device formed on the semiconductor substrate and the first photoresist layer;
    performing an annealing process to form a first silicide on a source-drain region of the second device;
    removing unreacted portions of the first metal layer after performing the annealing process;
    removing the first photoresist layer;
    forming a second metal layer on the first device and the second device;
    performing an annealing process to form a second silicide on a source-drain region of the first device, wherein the annealing process to form the second silicide comprising:
        performing a first anneal within a first temperature range;
        removing unreacted portions of the second metal layer; and
        performing a second anneal within a second temperature range.

2. The method of claim 1, wherein the first photoresist layer comprises:
    a resist material able to withstand a post-exposure bake (PEB) temperature ranging from approximately 70° C. to approximately 115° C. for approximately 60 seconds.

3. The method of claim 1, wherein the performing an annealing process to form the first silicide on the source-drain region of the second device comprises performing a laser annealing process.

4. The method of claim 1, wherein performing an annealing process to form the first silicide on the source-drain region of the second device comprises:
    performing a first anneal within a first temperature range;
    removing unreacted portions of the first metal layer; and
    performing a second anneal within a second temperature range.

5. The method of claim 1, wherein the performing the annealing process to form the second silicide on the source-drain region of the first device comprises a laser annealing process.

6. The method of claim 1, further comprising:
    forming a second photoresist layer over the second device and the first silicide before forming the second metal layer on the first device and the second device, the second photoresist layer comprising a resist able to withstand a post-exposure bake (PEB) temperature ranging from approximately 70° C. to approximately 115° C. for approximately 60 seconds.

7. The method of claim 1, wherein the forming the second silicide on the source-drain region of the first device changes the composition of the first silicide.

8. The method of claim 1, wherein the second silicide has a different thickness than the first silicide.

* * * * *